United States Patent [19]

Nishizawa et al.

[11] 4,270,059
[45] May 26, 1981

[54] STATIC INDUCTION TRANSISTOR LOGIC CIRCUIT

[75] Inventors: Jun-ichi Nishizawa; Tadahiro Ohmi, both of Sendai, Japan

[73] Assignee: Zaidan Hojin Handotai Kenkyu Shinkokai, Sendai, Japan

[21] Appl. No.: 907,318

[22] Filed: May 18, 1978

[30] Foreign Application Priority Data

May 28, 1977 [JP] Japan .................................. 52-62648

[51] Int. Cl.³ .................. H03K 19/091; H03K 19/20; H01L 27/04; H01L 29/80
[52] U.S. Cl. .................................... 307/446; 357/22; 357/92
[58] Field of Search ............... 307/203, 213, 214, 304, 307/215; 357/92, 22

[56] References Cited

U.S. PATENT DOCUMENTS

| | | | |
|---|---|---|---|
| 4,009,397 | 2/1977 | Mulder et al. | 357/15 X |
| 4,012,684 | 3/1977 | Schade, Jr. | 307/297 X |
| 4,198,648 | 4/1980 | Nishizawa | 357/43 |

FOREIGN PATENT DOCUMENTS 2655917  6/1977  Fed. Rep. of Germany ............. 357/92

OTHER PUBLICATIONS

Nishizawa et al., "Junction Field-Effect Transistor Designed for Speedy Logic;" *Electronics*, pp. 4E, 6E; 8/19/76.

Mulder et al., "High Speed I²L;" *IEEE-JSSC*, vol. SC-11, No. 3, pp. 379-385; 6/1976.

Elmasry, "Nonsaturated Integrated Injection Logic," *Electronic Letters;* pp. 63-64; vol. 11, No. 3; 2/6/75.

*Primary Examiner*—Larry N. Anagnos
*Attorney, Agent, or Firm*—Cushman, Darby & Cushman

[57] ABSTRACT

A static induction transistor logic circuit comprising: an injector transistor having a control electrode held at a reference potential, a first electrode, and a second electrode applied with a potential to thereby cause a current having a value determined by the potential applied to flow through the first electrode; a driver static induction transistor having a gate connected to said first electrode of the injector transistor, a drain, and a source held at said reference potential; and a bypath static induction transistor having a gate, a drain connected to both the gate of the bypath transistor and said gate of said driver transistor, and a source held at said reference potential, said bypath transistor being operative so that when said driver transistor is in its conductive state, the bypath transistor becomes conductive to allow a part of said current supplied from said first electrode to flow through the bypath transistor, with a certain potential developed at the drain of the bypath transistor, said certain potential, when applied at said gate of said driver transistor, allowing said driver transistor to turn to be conductive, and having a value associated with that of said current supplied from said first electrode.

7 Claims, 11 Drawing Figures

STATIC INDUCTION TRANSISTOR LOGIC CIRCUIT

BACKGROUND OF THE INVENTION (a) Field of the invention

The present invention is related to a static induction transistor logic (SITL) circuit.

(b) Description of the prior art

The SITL circuit is a unique modification of the conventional IIL circuit and is comprised of a driver static induction transistor and an injector bipolar transistor. This SITL circuit has been employed in those semiconductor devices such as disclosed in Japanese patent application No. 50-146588 (corresponding U.S. patent application Ser. No. 748,292/1976 by Jun-ichi NISHIZAWA) and in Japanese patent application No. 51-92467 (corresponding U.S. patent application Ser. No. 819343/1977 by Jun-ichi NISHIZAWA et al) for instance.

In FIG. 1 is illustrated a basic example of the SITL circuit, in which $Q_i$ is the injector bipolar transistor of pnp type and $Q_d$ is the driver static induction transistor of n-channel type. The collector C of the injector transistor $Q_i$ is connected to the gate G of the driver transistor $Q_d$. The base B of the injector transistor $Q_i$ is connected to the source S of the driver transistor $Q_d$. For usual operation, a constant voltage $V_{EE}$ is applied to the emitter E of the injector transistor $Q_i$, thus causing a substantially constant current to flow through the injector transistor $Q_i$. In case the input terminal, i.e. the gate G of the driver transistor $Q_d$, is opened, the gate capacitance of the driver transistor is charged with a current supplied by the injector transistor up to a high potential, so that the driver transistor turns to be conductive with its drains $D_1$ and $D_2$ being substantially grounded. On the other hand, when the gate G of the driver transistor is shorted to the source S, the current supplied by the injector transistor is allowed to flow through the shorting path, and the gate capacitance of the driver transistor is discharged, so that the driver transistor turns to be non-conductive, thus the drains $D_1$ and $D_2$ being rendered to a high impedance condition, and a high-level voltage.

As such, the manner of operation of the SITL circuit can be said to be similar to that of the conventional IIL circuit, but the SITL circuit has many advantages over the conventional IIL circuit, as will be described below.

First, a static induction transistor, basically, is a majority carrier control device, and therefore the minority carrier storage effect in the driver static induction transistor is greatly reduced as compared with that noticed in the driver bipolar transistor of the conventional IIL device. Consequently, the SITL device can make switching operations at a greatly increased speed.

Second, the static induction transistor, basically, is a voltage-controlled device, so that only a small amount of power is required for driving the driver static induction transistor and that the driver transistor can be easily coupled to an external circuit. Also, the power loss in the driver static induction transistor itself is small. Accordingly, the SITL circuit will allow a high density integration.

Third, a static induction transistor has a large transconductance and can provide a large number of fan-outs. As a result, the SITL circuit can consititute any logic circuit as required, in a simplified arrangement.

Fourth, the SITL circuit is easy to be formed as an integrated semiconductor circuit as shown in FIGS. 2 and 3.

FIG. 2 shows a top plan view of an example of an integrated SITL circuit in which is incorporated two units of SITL circuits shown in FIG. 1. FIG. 3 illustrates a vertical section taken along the line III—III of FIG. 2. Each unit of the SITL circuit includes a semiconductor wafer 10 consisting of a heavily doped n+ type substrate 13 and a lightly doped n− type layer 14. In some case n+ layer 13 is a buried layer in a p type substrate. In the semiconductor layer 14 are provided a heavily doped p+ type region 11. and a heavily doped p+ type region 12 of a mesh-like shape. In the upper portion of the layer 14, those portions surrounded by the regions 12, there are provided heavily doped n+ type regions 15 and 16. Regions 11, 12 and a portion of the layer 14 which is sandwiched between these regions 11 and 12 jointly constitute a lateral bipolar transistor serving as an injector transistor $Q_i$ as shown in FIG. 1. In further detail, the region 11 functions as an emitter; the region 12 serves as a collector; and the sandwiched portion of the layer 14 serves as a base. On the other hand, regions 12, 13, 14, 15 and 16 form, jointly therewith, a static induction transistor serving as a driver transistor $Q_d$ as shown in FIG. 1. More particularly, the substrate 13 functions as a source; the region 12, functions as a gate; and the regions 15 and 16 serve as drains. The current channels of the static induction transistor are defined to be those portions of the layer 14 which are surrounded by the region 12. There are provided, on the corresponding locations, drain electrodes $D_1$ and $D_2$, a gate/collector electrode G/C, an emitter electrode E, and a source/base electrode S/B. A passivation film layer 17, such as a silicon dioxide film layer, is formed on the exposed upper surface of the semiconductor wafer 10.

As will be easily understood from FIGS. 2 and 3, the SITL circuit can be manufactured as an integrated semiconductor circuit by relying on a simple processing technique wherein the impurity diffusion step is conducted only two times and four masks are required at most, for instance.

With such a simple structure as well as such a simple processing, there has been obtained an integrated SITL circuit whose power delay product for low current operation is decreased to as low as 0.002 pJ or less. Furthermore, a specimen of such integrated SITL circuit exhibiting a minimized delay time of 13.8 nanoseconds or less in an operation with a power dissipation of 230 micro-watts has been materialized according to the structure of FIGS. 2 and 3. In this specimen, the semiconductor layer 14 has an impurity concentration of about $10^{14}$ atoms/cm$^3$ and a thickness of about 6 micro-meters, the gate region 12 has an impurity concentration of about $10^{17}$ atoms/cm$^3$ or more, and a thickness of about 2 micro-meters, and the gate mask distance is set to be about 6 micro-meters. The above-mentioned delay time of the SITL circuit contains several factors such as a delay for charging up the gate capacitance of the driver transistor, a delay for carrier transit across the source and the drain of the driver transistor, a carrier storage effect due to unnecessary minority carriers injected from the gate into a high resistivity region around the gate other than the current channel of the driver transistor, a carrier storage effect due to excessive minority carriers injected from the gate into the current channel, and like factors. The former three factors may be reduced drastically, by minimizing the thickness of the high resistivity layer 14 (see FIG. 3) to thereby bring the gate 12 into a substantial contact with the low resistivity layer 13, and thereby to reduce the effective distance between the source and the drains, and by minimizing the effective area of the gate 12, for instance. The provision of an insulator region at the outer boundary of the gate of the driver transistor may be effective for preventing the occurrence of an unnecessary carrier injection at the boundary. The last factor may also be somewhat reduced by a decrease in the gate area. In this manner, there has been obtained, in fact, a specimen of the SITL device whose delay time is reduced to as small as 4 nano-seconds or less.

The afore-mentioned excellent operating characteristic of the SITL circuit can never be attained by the use of a conventional IIL circuit, particularly by the use of the conventional IIL circuit designed to provide many fan-outs. Some known modified IIL circuit comprised of only bipolar transistors, such as the known VIL (Vertical Injection Logic) circuit and SSL (Self-Aligned Super Injection Logic) circuit, might be seen as being somewhat comparable to the SITL circuit only in the delay time characteristic (representative minimum delay time is 8 nano-seconds), but their power-delay product is roughly thirty times or more as large as that of the SITL device. Moreover, these known modified IIL circuits are extremely hard to be formed into an integrated semiconductor circuit having a simplified structure.

The SITL circuit of the prior art, though it has many excellent features as described above, still leaves a problem to be improved. This problem is represented by the minority carrier storage effect which is developed in the driver transistor. This carrier storage effect is caused by an excessively large amount of minority carriers injected into the current channel from the gate of the driver transistor when the driver transistor is in the conducting state. Namely, the current which is supplied by the injector transistor, after having charged the gate capacitance of the driver transistor up to a required potential, will continue to flow, to charge the gate capacitance up to an excessively high potential, because the injector current is usually kept almost constant. As a result, the gate junction of the driver transistor is deeply forwardbiased, so that an excessively large amount of carriers are injected, thus bringing about the above-mentioned carrier storage effect in the driver transistor. Since a static induction transistor employed for the driver transistor, basically, is a majority carrier control device, the degree of the carrier storage effect which develops in the driver transistor is very low as compared with that in the driver bipolar transistor of the conventional IIL circuit. However, the carrier storage effect constitutes a great obstruction in attaining a further increase in the operating speed of the SITL circuit of the prior art.

To eliminate such carrier storage effect in the driver transistor of the SITL circuit, it has been found very effective to use a modification of the circuit such that the injector bipolar transistor is replaced by a static induction transistor. This modified SITL circuit has been proposed in Japanese Patent Application No. 52-4633 (corresponding U.S. patent application No. 867298/1978 by Jun-ichi NISHIZAWA), and in Japanese Patent Application No. 52-15879, laid open Sept. 2, 1978 with publication No. 53,100783, wherein the inventor is Jun-ichi NISHIZAWA. Suppose, here, that a device which is employed as an injector transistor has such ideal drain voltage $V_{ds}$ versus drain current $I_d$ characteristic as shown by the solid line in FIG. 4, in which after the gate potential of the driver transistor has exceeded a certain potential $V_{go}$ necessary to render the driver transistor conductive, the injector current $I_d$ becomes suppressed to a desirable minimized value. In case an injector transistor has such characteristic as stated just above, the unnecessary excessive minority carrier injection in the driver transistor can be suppressed, and thus the carrier storage effect is greatly reduced. In addition, if the injector transistor is able to supply a sufficiently large amount of current to quickly charge the gate capacitance of the driver transistor up to said certain potential $V_{go}$, a sufficiently high speed turning-on operation could be performed by the drive transistor. It should be noted, however, that an actual static induction transistor has such a drain voltage versus drain current characteristic as shown by the dash-and-dot line in FIG. 4. Namely, as the gate capacitance of the driver transistor is being charged up with the injector drain current and as, thus, the gate potential of the driver transistor together with the drain potential of the injector transistor is being pulled up, the drain current of the injector transistor will tend to gradually decrease because of its decreasing drain voltage. For this reason, practically speaking, it is impossible to accomplish at the same time both the elimination of the excessive minority carrier injection and the quick charging-up of the gate capacitance of the driver transistor, in accordance with such arrangement of the SITL circuit wherein the injector bipolar transistor is replaced by a static induction transistor.

SUMMARY OF THE INVENTION

It is, therefore, an object of the present invention to provide an improved SITL circuit which is capable of making switching actions at an increased speed.

Another object of the present invention is to provide an SITL circuit of the type described above, in which the driver transistor is substantially free from the minority carrier storage effect.

A further object of the present invention is to provide an SITL circuit of the type described above, in which the potential level for input and/or output of the driver transistor is selectable over a wide range.

According to one aspect of the present invention, there is provided an SITL circuit comprising: a driver static induction transistor having a drain, a gate, and a source which is held at a reference potential; an injector bipolar transistor having a base held at said reference potential, a collector connected to said gate of said driver transistor, and an emitter applied with a potential to thereby cause a collector current whose value is associated with the value of the potential applied to the emitter to flow through the collector; and a bypath static induction transistor having a source held at said reference potential, a drain connected to said gate of said driver transistor, and a gate connected to the drain of the bypath transistor; said bypath transistor being operative so that when a certain potential is applied to the drain of the bypath transistor, it becomes conductive to thereby allow a part of said collector current to flow through the bypath transistor; said certain potential, when applied to said gate of said driver transistor, allowing said driver transistor to turn to be conductive; the value of said certain potential depending upon the value of said collector current.

According to another aspect of the present invention, said injector bipolar transistor is replaced by a junction- or MOS- type field affect transistor having a saturated drain voltage versus drain current characteristic.

These and other objects as well as the features and the advantages of the present invention will become apparent from the following detailed description of the preferred embodiments when taken in conjunction with the accompanying drawings.

DESCRIPTION OF THE PREFERRED EMBODIMENTS

Figure 1:
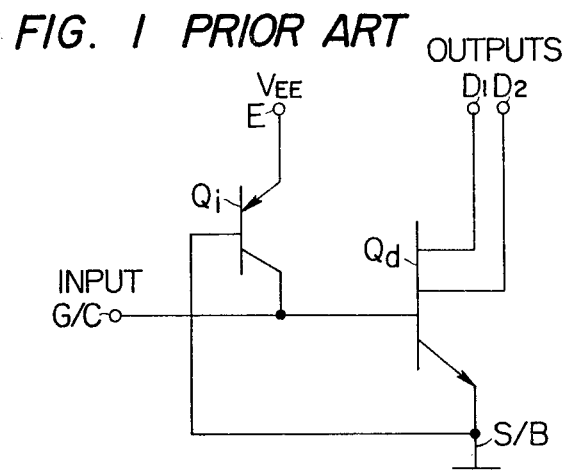
FIG. 1 is a circuit diagram showing an SITL circuit of the prior art.
Figure 2:
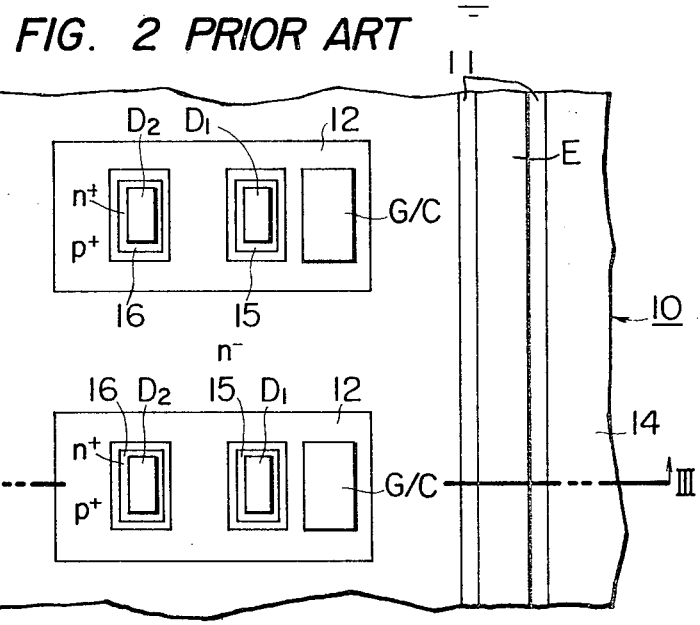
FIG. 2 is a diagrammatic top plan view of an integrated semiconductor circuit incorporating the SITL circuits of FIG. 1.
Figure 3:
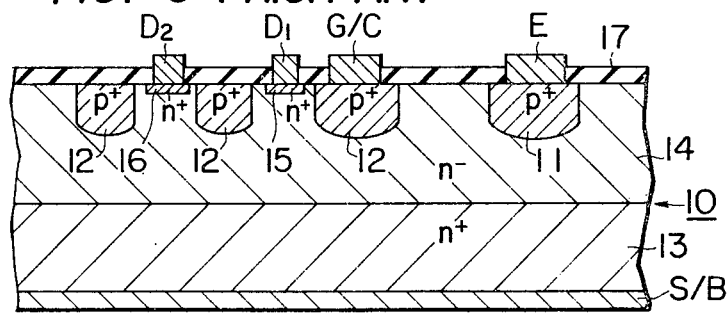
FIG. 3 is a diagrammatic vertical sectional view taken along the line III—III of FIG. 2.
Figure 4:
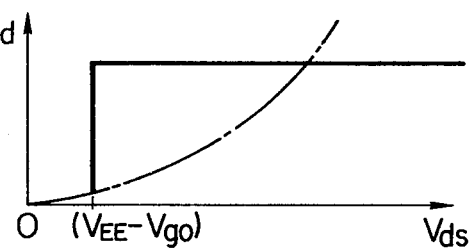
FIG. 4 is a chart for explaining a problem encountered during the attempts of improving the operating characteristic of the prior art SITL circuit.
Figure 5:
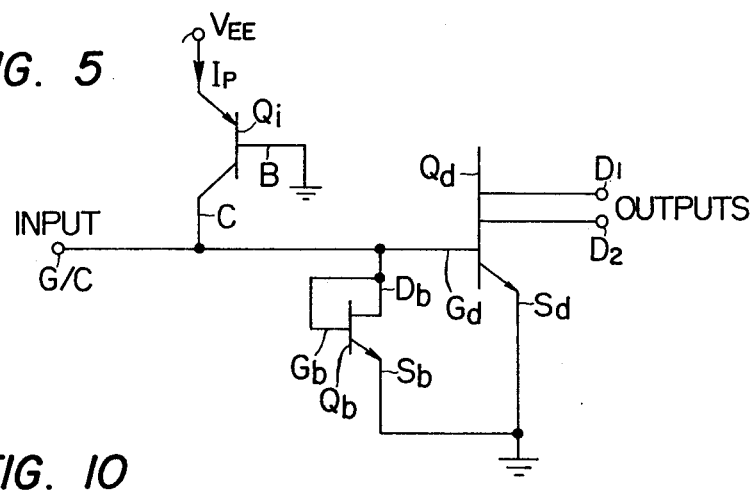
FIG. 5 is a circuit diagram showing an example of the SITL circuit according to the present invention.

In FIG. 5 is illustrated an example of the SITL circuit according to the present invention, which is comprised of an injector bipolar transistor $Q_i$ of pnp type, a driver static induction transistor $Q_d$ of n-channel type, and a bypath static induction transistor $Q_b$ of n-channel type. According to another aspect of the present invention, the injector transistor may be replaced by a junction- or MOS- type field effect transistor having a saturated drain voltage versus drain current characteristic. The injector transistor $Q_i$ has a base held at a reference potential, e.g. the ground potential, a collector connected to the gate of the driver transistor $Q_d$, and an emitter applied with a potential $V_{EE}$ to thereby allow a collector current having a value associated with the potential $V_{EE}$ to flow through the collector. The source of the driver transistor $Q_d$ is held at the reference potential. In this embodiment, the driver transistor is provided with two drains $D_1$ and $D_2$, but the number of the drains of the driver transistor is not limited to only two, but it may be one, or may be more than two. The bypath transistor has a source $S_b$ held at the reference potential, a gate $G_b$ and a drain $D_b$ jointly connected to the gate of the driver transistor.

The bypath transistor has a connection between the gate and the drain thereof, as described above. Therefore, the bypath transistor exhibits a particular voltage-current characteristic wherein the drain current will non-linearly increase with an increase in the drain voltage. The increasing curve of the drain current with respect to an increase in the drain voltage is dependent mainly upon the ratio of the distance between the drain and the intrinsic gate, which gate being the extreme point of the potential barrier induced in the current channel, to the distance between the intrinsic gate and the source. In general, when the value of the above said ratio is a greater one, the bypath transistor will exhibit a more gentle incrementation in the drain current for an increase in the drain voltage. In the SITL device of the present invention, the voltage-current characteristic of the bypath transistor should be determined in such a way that, when the driver transistor is in the conductive state, it also turns to be conductive to allow at least a part, preferably the major part, of the collector current of the injector transistor to flow through this bypath transistor while developing, across its drain and source, a voltage drop of a value associated with the value of the drain current.

The operation of the afore-mentioned embodiment of the present invention will be explained below.

Suppose now that an external switching device, such as a static induction transistor, is connected across the gate of the driver transistor, i.e. the input terminal of the SITL circuit and the reference potential point.

In case the external device in the preceding stage is turned "on" and when the current supplied from the conductive injector transistor is all sunk in the external device, the gate of the driver transistor is held at a substantially low level voltage such as 0.1~0.2 V, for instance. Under this condition, both the driver transistor and the bypath transistor are rendered to the "off" state, because the current channels of these transistors are pinched-off by the gate-channel depletion layers, and because there are thus developed high potential barriers in the current channels. In other words, the static induction transistors $Q_d$ and $Q_b$ are designed so that the gate-channel diffusion potential may cause the gate-channel depletion layers extending from the gate to spread all over the current channel. The higher the impurity concentration of either the gate or the current channel is, and also the more abrupt the impurity concentration change at the boundary between the gate and the current channel is, the larger will become the gate-channel diffusion potential. As the gate-channel diffusion potential increases, the static induction transistor logic will be able to have a wider logic voltage swing between the low level and the high level.

Conversely, when the preceding stage external device is turned "off", the collector current of the injector transistor will turn to flow toward the gate of the driver transistor and to the bypath transistor. At the onset, a large part of the collector current will flow into the gate of the driver transistor, because the gate potential of the driver transistor and the drain potential of the bypath transistor still are both very low, and because the bypath transistor is kept substantially non-conductive. Accordingly, the gate capacitance of the driver transistor is rapidly charged up, with the result that there develops a quick rise in the potential at the driver gate up to a certain gate potential $V_{go}$ which will allow the driver transistor to turn to be conductive. A typical value of the certain gate potential $V_{go}$ is 0.5~0.8 volt in case of a static induction transistor formed with a silicon material. As a result, the driver transistor is turned "on" immediately after the turning-off of the preceding stage external device. After the driver transistor has thus been rendered conductive, the bypath transistor also turns to be conductive, so that a large part of the collector current of the injector transistor, in turn, is allowed to flow through the bypath transistor. Therefore, the gate potential of the driver transistor is limited to a certain potential which is determined by both the voltage-current characteristic and the emitter potential $V_{EE}$ value, so that the unnecessary excessive carrier injection into the driver gate is effectively suppressed. Consequently, the carrier storage effect in the driver transistor is greatly reduced.

It should be noted here that an adequate amount of minority carriers is constantly injected from the gate into the current channels of the driver transistor to hold the driver transistor in the conducting state. Therefore, the voltage-current characteristic of the bypath transistor must meet the above requirement for the driver transistor. Namely, the internal resistance of the bypath transistor in the conductive state needs to be held relatively higher than that of the driver transistor in the conducting state. This condition may be accomplished by setting the width of the current channel of the bypath transistor to be slightly smaller than that of each of the current channels of the driver transistor. Alternatively, for the same purpose, the impurity concentration of the bypath transistor channel needs to be determined so as to be slightly lower than that of the current channels of the driver transistor. In short, the bypath transistor should be designed so that there may be induced in its current channel a slightly higher potential barrier than those induced in the current channels of the driver transistor.

When the preceding stage external device is turned "on" again, the driver transistor will immediately turn "off" because of the minimized minority carrier storage effect in the driver transistor.

As described above, according to the present invention, there can be obtained an improved SITL circuit which is superior in the operation speed as compared to the prior art SITL circuit.

In the SITL circuit of the present invention, the bypath transistor is given such a voltage-current characteristic that the drain voltage will increase with a certain gradient in accordance with an increase in the drain current, as described previously. In other words, the value of the drain voltage of the bypath transistor in the conductive state is dependent upon the value of the emitter potential $V_{EE}$, because the drain current is a part of the collector current of the injector transistor, and because the value of the collector current is determined depending on the value of the emitter potential $V_{EE}$. This will give the SITL circuit of the present invention another advantage that the voltage for the signal supplied can increase gradually with an increase in the emitter potential $V_{EE}$. This variability is often required in the applications of the SITL circuit.

Figure 6A:
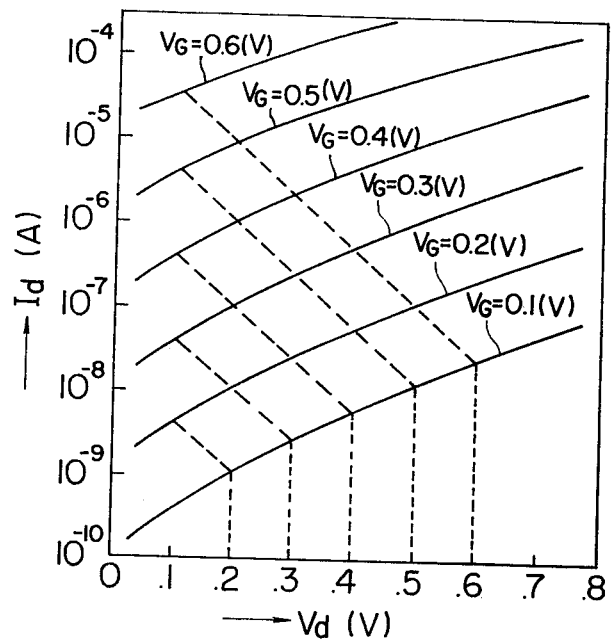
FIGS. 6A and 6B are charts illustrating an example of the drain voltage versus drain current characteristics of the driver and bypath transistors in the SITL circuit according to the present invention, respectively.
Figure 6B:
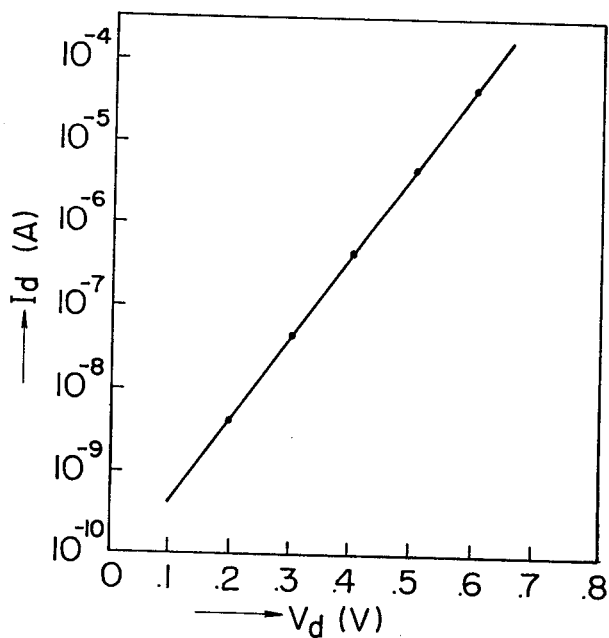

If the driver transistor represents such a drain voltage $V_d$ versus drain current $I_d$ characteristic as shown in FIG. 6A, the drain voltage $V_d$ versus drain current $I_d$ characteristic of the bypath transistor may be determined as shown in FIG. 6B, for instance. In FIG. 6A, $V_g$ represents the gate voltage of the driver transistor. This characteristic of FIG. 6B is determined so as to satisfy, for a wide range of variation of the potential $V_{EE}$ applied at the injector transistor emitter, the conditions of $V_H - V_L > 0$, and also to satisfy the condition that when the gate potential of the driver transistor, i.e. the input potential of the SITL circuit, is at a certain level $V_H$, some of the injection current supplied by the injector transistor is allowed to flow through the bypath transistor. Where, $V_H$ and $V_L$ represent a high level and a low level of the input and output of the SITL circuit, respectively.

Let us now suppose that a logic circuit comprised of two SITL units are connected in a cascade manner, and that in each of these units the driver transistor and the bypath transistor have the voltage-current characteristic of FIGS. 6A and 6B, respectively. When the potential $V_{EE}$ is set at a relatively low potential, the output potential of the first stage SITL circuit is variable between 0.1 volt (the low output level) and 0.2 volt (the high output level). In this condition, the input potential of the second stage SITL circuit is varied between 0.1 volt (the low input level) and 0.2 volt (the high input level). Alternatively, when the potential $V_{EE}$ is determined to be a relatively high potential, the output potential of the first stage SITL circuit is variable between 0.1 volt (the low output level) and 0.6 volt (the high output level). At the same time, the input potential of the second stage SITL circuit is variable between 0.1 volt (the low input level) and 0.6 volt (the high input level). As is apparent from the above explanation, the possible high level assigned for either the input or the output may be freely varied in accordance with the potential $V_{EE}$.

Figure 7:
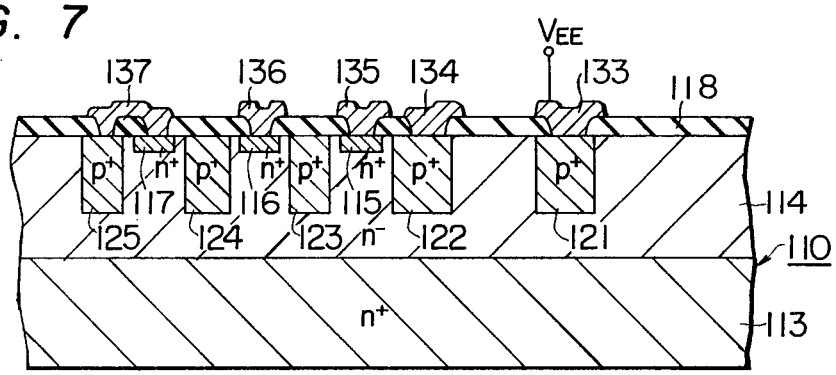
FIGS. 7, 8 and 9 ae diagrammatic vertical sectional views of different examples of integrated semiconductor circuits incorporating the SITL circuit of FIG. 5, respectively.

An example of the integrated semiconductor circuit incorporating the SITL circuit of FIG. 5 is shown, in vertical section, in FIG. 7. The integrated SITL circuit includes a semiconductor wafer 110 comprised of a heavily doped $n^+$ type substrate 113 and a lightly doped $n^-$ type layer 114. In some cases, the $n^+$ layer 113 is a buried layer in the p type substrate. The semiconductor layer 114 may be formed by relying on the conventional epitaxial growth technique or diffusion technique, for instance. In the semiconductor layer 114, which is made of silicon for instance, there are provided individual highly doped $p^+$ type regions 121, 122, 123, 124 and 125. The regions 122 through 125 need to be held at a same potential, so that they are electrically connected together. In general, all of the regions 122 through 125 preferably may be formed in a continuous form such as a grid, mesh shape on stripe shape. At those locations in the semiconductor layer 114 which are surrounded by the respective regions 122 through 125, there are provided separate heavily doped $n^+$ type regions 115, 116 and 117. There are deposited ohmic electrodes 133, 134, 135 and 136 on the regions 121, 122, 115 and 116, respectively. Also, an ohmic electrode 137 is deposited to make ohmic connection between the two regions 124 and 125. Reference numeral 118 represents a passivation film of an insulating material such as silicon dioxide, which covers the exposed portions of the upper surface of the semiconductor layer 114.

The $n^+$ type layer 113 and the $n^+$ type regions 115 through 117 have an impurity concentration of $10^{18} \sim 10^{21}$ atoms/cm$^3$. The $n^-$ type layer 114 has an impurity concentration of $10^{11} \sim 10^{15}$ atoms/cm$^3$. Each of the $p^+$ type regions 121 through 125 has an impurity concentration of $10^{17} \sim 10^{21}$ atoms/cm$^3$.

Description will now be made on the co-relationship between FIG. 5 and FIG. 7. The driver transistor $Q_d$ comprises layers 113 and 114, and regions 115, 116, 122, 123 and 124. More particularly, the layer 113 serves as the source $S_d$; the regions 122 through 124 serve as the gate $G_d$; the regions 115 and 116 serve as the drains $D_1$ and $D_2$; and those portions of the layer 114 which are surrounded by the respective regions 122 through 124 serve as separated current channels. Similarly, the bypath transistor $Q_b$ is constituted by the layer 113 serving as the source $S_b$, the region 117 serving as the drain $D_b$, the regions 124 and 125 working as the gate $G_b$, and that portions of the layer 113 which serves as the current channel and which is surrounded by the regions 124 and 125. On the other hand, the regions 121 and 122 constitute the emitter E and the collector C of the injector transistor $Q_i$. Also, a portion of the layer 114 located between the emitter and the collector serves as the base B of the injector transistor $Q_i$. As will be apparent, the collector of the injector transistor $Q_i$ and the gate of the bypath transistor $Q_b$ are merged into the gate of the driver transistor $Q_d$, respectively, thereby being held at the same potential with that of the driver gate. Similarly, the source of the bypath transistor $Q_b$ and the base of the injector transistor $Q_i$ are held at the same potential with the source potential of the driver transistor $Q_d$.

Figure 8:
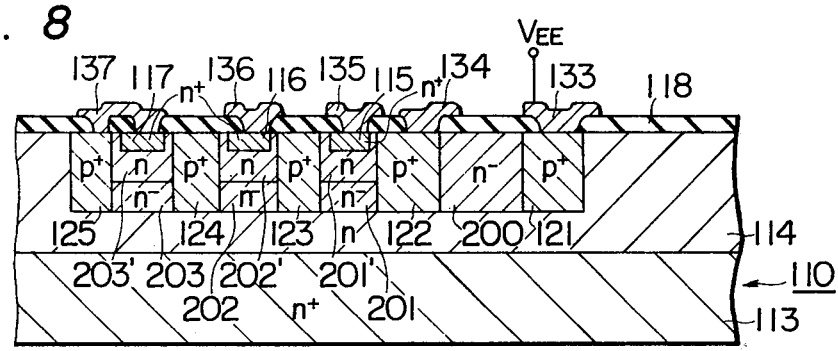

A modification of the integrated SITL circuit of FIG. 7 is shown in vertical section in FIG. 8. In this example, the impurity concentration of those portions 200, 201, 202 and 203 which serve actually as the base of the injector transistor and the current channles of the driver and bypath transistors, is set to be lower than that of the remaining portions in the layer 114 excepting the gates 122 through 125 and the emitter 121. For instance, the former impurity concentration is set to be about $10^{11} \sim 10^{15}$ atoms/cm$^3$ and the latter impurity concentration is determined to be about $10^{15}$ atoms/cm$^3$ or more. With this arrangement, the minority carriers are allowed to be injected mainly into the real current channel regions 201 through 203 from the gate regions 122 through 125, and also effectively into the base region 200 from the emitter region 121. Because the diffusion potential difference is large, the injection of holes from the p$^+$ type gate regions 122$\sim$125 into the n type regions 201'$\sim$203' which are located between the n$^-$ type regions 201$\sim$203 and the n$^+$ type regions 115$\sim$117, respectively, is not much intensive. In other words, this arrangement is attributed to a reduction in the unnecessary injection of minority carriers into those high resistivity regions other than the real current channels and the base, and to a further reduction in the minority carrier storage effect in the SITL device.

Needless to say, as the gate regions of the driver transistor is arranged to be smaller, the gate capacitance as well as the minority carrier storage effect of the driver transistor become all the more reduced. Therefore, in the integrated SITL circuits of FIGS. 7 and 8, the known ion-implantation technique may preferably be applied for forming the gate regions small in size.

Figure 9:
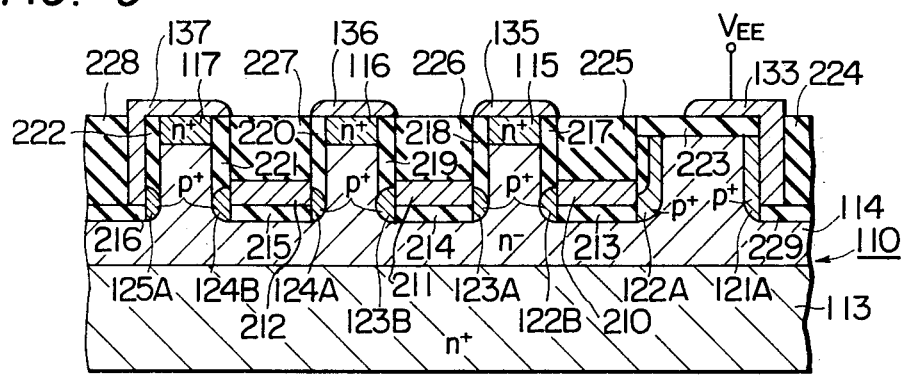

A still another modification of the integrated SITL circuit of FIG. 7 is illustrated in vertical section in FIG. 9, in which the gates of both the driver transistor and the bypath transistor are formed into minute p$^+$ type regions 122B, 123A, 123B, 124A, 124B and 125A, and in which the collector of the injector transistor is formed as a p$^+$ type region 122A separated from the gate region 122B. All of the respective gate (or collector) regions 122A, 122B, . . . , 125A are electrically and mutually connected to conducting layers 210, 211 and 212 of a conducting material such as aluminum, molybdenum, low-resistivity polysilicon, and so forth. The conducting layers 210, 211 and 212 are isolated from the high resistivity layer 114 as well as from the drain regions 115, 116 and 117 by insulating layers 213 through 223 of an insulator material such as SiO$_2$, Si$_3$N$_4$, Al$_2$O$_3$ and a combination of any of these materials, thus providing the so-called step-cut structure having recesses. Reference numerals 224 through 228 represent insulating layers, respectively, of an insulator material such as SiO$_2$, Si$_3$N$_4$, Al$_2$O$_3$, high-resistivity polysilicon, polyimide resin and so forth. The electrode 137 is separated from the high resistivity layer 114 and from the drain region 117 by the insulating layers 216, 222 and 228, and similarly the electrode 133 is separated from the high resistivity layer 114 by the insulating layers 223, 224 and 229.

This arrangement can provide a further improved operation characteristics as will be described below in detail. Each of the gate regions 122B, . . . , 124A can be easily formed into a minute dimension as well as into a heavily-doped region, by relying on the selective diffusion technique for forming the gate regions prior to the formation of the insulating lyers 225, . . . , 227 and the conducting layers 210, . . . , 212. In addition, those portions of these gate regions other than that which contacts the effective current channels are covered with the insulating layers to thereby be separated from any adjacent high-resistivity region of the layer 114. Therefore, the gate capacitance of the driver transistor can be greatly minimized. Moreover, almost all of the carriers injected into the gate regions from the emitter of the injector transistor are allowed to be drawn exclusively into the current channels, so that the minority carrier storage effect of the driver transistor is greatly reduced. Minority carriers are injected only into the channel, and this is effective in reducing the source to drain resistance of the driver transistor. Furthermore, the emitter 121A and the collector 122A may be formed easily with a small distance left therebetween, by relying on the selective diffusion technique for forming these regions prior to the formation of the insulating layers 224, 225, 223 and 229 and the electrode 133, with the result that an increased current transfer factor (common-base current gain) is obtained in the injector transistor. For those reasons described above, the driver transistor in the integrated SITL circuit of FIG. 9 can make switching actions (turn-on as well as turn-off actions) at a greatly increased speed.

It should be noted here that the SITL circuit of the present invention includes an additional transistor, i.e. a bypath transistor for suppressing the occurrence of an unrequired excessive carrier injection in the driver transistor. However, the bypath transistor is a static induction transistor, and may be easily formed simultaneously with the formation of the driver transistor with little degradation of the integration density.

Additionally speaking, in the aforementioned integrated SITL circuit, it is effective for a further enhancement of the operation speed to provide on the source region (low resistivity layer 113) projections extending toward the corresponding current channels, as disclosed in Japanese patent application No. 51-143698 (corresponding U.S. patent application Ser. No. 855617/1977, now U.S. Pat. No. 4,115,793, by Jun-ichi NISHIZAWA). This modification will result in a reduction in the series resistance as well as in the carrier transit time between the source and the drain, and also result in an increased transconductance. This will lead to an increase in the operation speed of the driver transistor. Moreover, a further reduction in the storage effect in the driver transistor may be attained by bringing the gate of the driver transistor into a substantial contact with the source. It should also be understood that all of the respective semiconductor layers or regions in the integrated SITL circuit may be reversed in their conductivity types. Namely, the driver and bypath transistors as well as the injector transistor may be replaced by p-channel type static induction transistors and an npn-type bypolar tansistor, respectively. Furthermore, the driver transistor could be replaced by a field effect transistor.

Figure 10:
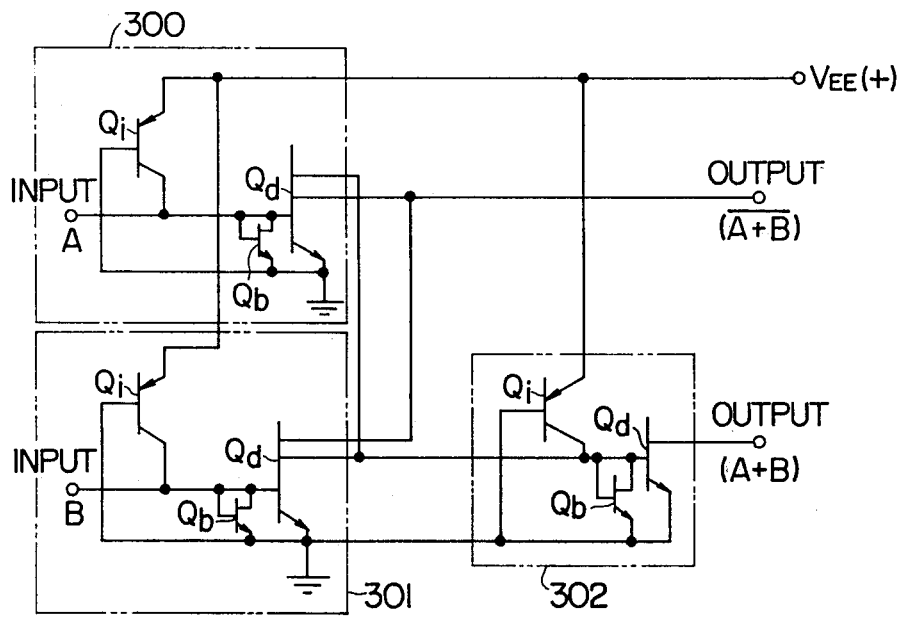
FIG. 10 is a circuit diagram of a logic circuit comprised of three units of the SITL circuits of the present invention.

FIG. 10 shows an example of the logic circuit constructed with several SITL circuits of the present invention. This logic circuit includes three circuit units 300, 301 and 302 each of which is comprised of an SITL circuit of the present invention such as shown in FIG. 5, but the driver transistor $Q_d'$ of the SITL circuit unit 302 has only one drain. The respective SITL circuit units 300, 301 and 302 may be formed in a discrete fashion, or they may be formed integrally in a single common semiconductor wafer. The emitters of the injectors $Q_i$ in the respective SITL circuit units 300, 301 and 302 are connected to a line applied with a constant voltage $V_{EE}$ (positive). The sources of the driver transistors $Q_d$ in the respective SITL circuit units are grounded. The drains of the driver transistors $Q_d$ in the SITL circuit units 300 and 301 are mutually wired. At the gates of the driver transistors $Q_d$ in the SITL devices 300 and 301 are applied two input signals A and B, respectively.

When both input signals assume the logical "0" level (e.g. a low level voltage), the driver transistors $Q_d$ of the SITL circuit units 300 and 301 are rendered to the "off" state, and then the driver transistor $Q_d$ in the SITL circuit unit 302 is rendered to the "on" state. If both input signals A and B are at the logical "1" level (a high level voltage), the driver transistors of the SITL circuit units 300 and 301 will be caused to turn "on", so that the driver transistor of the SITL circuit unit 302 is turned "off". In case the input signal B is at the logical "1" level but in case the input signal A is at the logical "0" level, the driver transistor of the SITL circuit unit 301 is turned "on" while the driver transistor of the SITL circuit unit 300 is turned "off". Accordingly, in this condition, the driver transistor of the SITL circuit unit 302 is in the "off" state. In short, at the drain of the driver transistor in the SITL circuit unit 302 is delivered the logical sum (OR) of the two inputs A and B. On the other hand, the inverted logical sum (NOR) of these two inputs A and B is obtained at the respective drains of the driver transistors in the SITL circuit units 300 and 301.

What is claimed is:

1. A static induction transistor logic circuit comprising:

an injector transistor having a control electrode held at a reference potential, a first electrode, and a second electrode applied with a potential to thereby cause a current having a value determined by the potential applied to flow through the first electrode;

a driver static induction transistor having a gate connected to said first electrode of the injector transistor, a drain, and a source held at said reference potential; and a bypath static induction transistor having a gate, a drain connected to both the gate of the bypath transistor and said gate of said driver transistor, and a source held at said reference potential, said bypath transistor having in its conductive state a larger internal resistance than said driver transistor in its conductive state and being operative so that when said driver transistor is in its conductive state, the bypath transistor becomes conductive to allow a part of said current supplied from said first electrode to flow through the bypath transistor, with a certain potential developed at the drain of the bypath transistor, said certain potential, when applied at said gate of said driver transistor, allowing said driver transistor to turn to be conductive, and having a value associated with that of said current supplied from said first electrode.

2. A static induction transistor logic circuit according to claim 1, in which: said injector transistor is a bipolar transistor, and in which: said control, first and second electrodes of the injector transistor are a base, a collector and an emitter of the injector transistor, respectively.

3. A static induction transistor logic circuit according to claim 2, in which: said injector transistor is of pnp type, and in which: said driver and bypath transistors are of n-channel type, respectively.

4. A static induction transistor logic circuit according to claim 1, in which: said injector transistor is a field effect transistor, and said control, first and second electrodes of said injector transistor are a gate, a drain and a source of the injector transistor, respectively.

5. A static induction transistor logic circuit according to claim 1, in which: said part of said current is the major part of said current.

6. A static induction transistor logic circuit according to claim 1, wherein: said bypath transistor has a narrower channel than that of said driver transistor.

7. A static induction transistor logic circuit according to claim 1, wherein: said bypath transistor has a channel region of a lower impurity concentration than that of the channel region of said driver transistor.

* * * * *